US006833083B2

United States Patent
Imai et al.

(10) Patent No.: US 6,833,083 B2
(45) Date of Patent: Dec. 21, 2004

(54) THERMOELECTRIC MATERIAL AND THERMOELECTRIC CONVERTING ELEMENT USING THE SAME

(75) Inventors: Hideto Imai, Tokyo (JP); Yuichi Shimakawa, Tokyo (JP); Takashi Manako, Tokyo (JP); Yoshimi Kubo, Tokyo (JP)

(73) Assignee: NEC Corporation, Tokyo (JP)

( * ) Notice: Subject to any disclaimer, the term of this patent is extended or adjusted under 35 U.S.C. 154(b) by 350 days.

(21) Appl. No.: 10/082,965

(22) Filed: Feb. 25, 2002

(65) Prior Publication Data

US 2003/0056819 A1 Mar. 27, 2003

(30) Foreign Application Priority Data

Mar. 6, 2001 (JP) ........................................ 2001-061811

(51) Int. Cl.$^7$ .................. H01L 35/12; H01L 35/14; C01B 17/20; C01B 25/14
(52) U.S. Cl. ............................. 252/62.3 T; 252/62.3 S; 252/518.1; 423/511; 423/561.7; 136/203; 136/236.1; 136/239; 136/292; 136/240
(58) Field of Search ..................... 252/62.3 T, 62.3 S, 252/518.1; 423/511, 561.7, 561.1; 136/203, 236.1, 239, 292, 204; 429/231.1; 253/62.3 T, 62.3 S, 518.1, 507

(56) References Cited

U.S. PATENT DOCUMENTS

| 4,009,052 A | * | 2/1977 | Whittingham | ............... 429/304 |
| 4,040,917 A | * | 8/1977 | Whittingham | ............... 205/494 |
| 4,125,687 A | * | 11/1978 | Di Salvo et al. | ............ 429/338 |
| 4,826,743 A | * | 5/1989 | Nazri | ........................ 429/322 |
| 5,368,957 A | * | 11/1994 | Kozmik et al. | ............. 429/305 |
| 6,376,127 B1 | * | 4/2002 | Teranishi et al. | ......... 429/231.1 |
| 6,423,419 B1 | * | 7/2002 | Teer et al. | ................... 428/469 |

FOREIGN PATENT DOCUMENTS

| JP | 7-231122 | | 8/1995 | |
| RU | RD 236028 | * | 11/1983 | ............ H01M/1/01 |

OTHER PUBLICATIONS

Allan et al "High–pressure semiconductor–semimetal transition in TiS2", Physical Review–B, 1998, 57(9), pp 5106–5109.*
de Boer et al, "Titanium ditelluride: Band Structure, photoemission, electrical and m agnetic properties", Physical Review–B, 1984, 29(12), pp 6797–6809.*
Am ara et al, "Thermoelectric Power of TiS2", Physical Review–B, 1987, 36(12), pp 6415–6419.*

* cited by examiner

Primary Examiner—Yogendra N. Gupta
Assistant Examiner—Kallambella Vijayakumar
(74) Attorney, Agent, or Firm—Scully, Scott, Murphy & Presser

(57) ABSTRACT

Compounds are expressed by general formula of $A_xBC_{2-y}$ where $0 \leq x \leq 2$ and $0 \leq y < 1$, and have CdI2 analogous layer structures; A-site is occupied by at least one element selected from the group consisting of Li, Na, K, Rb, Cs, Mg, Ca, Sr, Ba, Ti, V, Cr, Mn, Fe, Co, Ni, Cu, Zn, Zr, Nb, Mo, Ru, Rh, Pd, Ag, Cd, Hf, Ta, W, Re, Ir, Pt, Au, Sc, rare earth elements containing Y, B, Al, Ga, In, Tl, Sn, Pb and Bi; B-site is occupied by at least one element selected from the group consisting of Ti, V, Cr, Zr, Nb, Mo, Hf, Ta, W, Ir, and Sn; C-site is occupied by at least one element selected from the group consisting of S, Se and Te; the compounds exhibit large figure of merit so as to be preferable for thermoelectric generator/refrigerator.

2 Claims, No Drawings

THERMOELECTRIC MATERIAL AND THERMOELECTRIC CONVERTING ELEMENT USING THE SAME

FIELD OF THE INVENTION

This invention relates to a thermoelectric material and a thermoelectric element and, more particularly, to a thermoelectric material in chalcogen series containing transition metal such as titanium and a thermoelectric converting element using the same.

DESCRIPTION OF THE RELATED ART

Alternative energy from fossil fuel and environmental conservation are important in the world, and are discussed worldwide. Thermoelectric converting technologies are attractive alternative energy sources. Thermoelectric conversion does not produce any anti-environmental gas such as carbon dioxide gas and nitrooxides. Waste heat is reused as electric energy through the thermoelectric conversion, and refrigerants adverse to the environment such as freon are not required for refrigerators. Thus, thermoelectric conversion is free from environmental destruction, and thermoelectric conversion technologies are promising.

The efficiency of the thermoelectric conversion is defined by the "figure of merit" ZT, and the figure of merit is expressed as $$ZT = S^2 T / \rho \kappa \qquad (1)$$

where S is Seebeck coefficient, T is temperature, $\rho$ is the electrical resistivity and $\kappa$ is the thermal conductivity. When the figure of merit increased in value, the thermoelectric converting efficiency is improved. From equation (1), it is understood that a large figure of merit is achieved by a substance which has a large Seebeck coefficient, small electrical resistivity and small thermal conductivity. The figure of merit has a certain temperature dependency unique to the thermoelectric material. For this reason, the thermoelectric materials have each temperature ranges available for applications.

Electric generators driven by steam turbines and compressor-type refrigerators are now the major thermoelectric converter. In order to achieve the thermoelectric efficiency larger than that of the electric generators/refrigerators by using the thermoelectric materials, the thermoelectric materials are to have the figure of merit ZT of the order of 3.

Even though such a large figure of merit ZT is difficult, certain thermoelectric materials are active in the relatively low temperature range, in which the steam turbines can not operate, and have a position superior to the conventional thermoelectric converters. Nevertheless, the thermoelectric materials are to exhibit the figure of merit greater than 1 for practical application.

Various non-oxide semiconductor thermoelectric materials have been proposed. Thermoelectric materials in the bismuth-tellurium series have the unique temperature range from room temperature to 400 degrees in centigrade, and exhibit good performance in the unique temperature range. Thermoelectric materials in the lead-tellurium series exhibit good performance until 700 degrees in centigrade, and silicon-germanium series exhibit good performance until 1000 degrees in centigrade. The thermoelectric materials in the bismuth-tellurium series are used for the thermoelectric refrigeration, and the thermoelectric materials in the lead-tellurium series and silicon-germanium series are used for the thermoelectric generation.

On the other hand, $(Zn_{0.98}Al_{0.02})O$, $AB_2O_4$, which is disclosed in Japanese Patent Application laid-open No. 7-231122, and $NaCo_2O_4$ are examples of the oxide thermoelectric material. A and B are metal elements, and In is contained in B site. $(Zn_{0.98}Al_{0.02})O$, $AB_2O_4$ and $NaCo_2O_4$ are proposed as thermoelectric generators using a high temperature heat source of the order of 700 degrees in centigrade and thermoelectric generators active from room temperature to high temperature range. However, those thermoelectric materials exhibit the figure of merit of the order of 1.

A problem inherent in the conventional thermoelectric materials is the low conversion efficiency. The conventional energy converters are undesirable from the viewpoint of the environment and safety. The petroleum, coal, natural gas and electric power generated by the nuclear power plants will be superceded by clean energy obtained through the thermoelectric conversion. If so, there will be a great demand for thermoelectric material greater in converting efficiency than the conventional thermoelectric materials in the bismuth-tellurium series, lead-tellurium series and silicon-germanium series.

SUMMARY OF THE INVENTION

It is therefore an important object of the present invention to provide thermoelectric material, which exhibits the thermoelectric converting efficiency greater than the conventional thermoelectric materials.

It is also an important object of the present invention to provide a thermoelectric generator, which achieves a high energy converting efficiency.

It is also an important object of the present invention to provide a thermoelectric refrigerator, which achieves a high energy converting efficiency.

In accordance with one aspect of the present invention, there is provided a compound having a $CdI_2$ analogous layer structure and expressed by general formula of $A_xBC_{2-y}$, where x is fallen within the range of $0 \leq x \leq 2$ and y is fallen within the range of $0 \leq y < 1$, the A is at least one element selected from the group consisting of lithium, sodium, potassium, rubidium and cesium, the B is at least one element selected from the group consisting of titanium, vanadium, chromium, zirconium, niobium, molybdenum, hafnium, tantalum, tungsten, iridium and tin, and the C is at least one element selected from the group consisting of sulfur, selenium and tellurium.

In accordance with another aspect of the present invention, there is provided a compound having a $CdI_2$ analogous layer structure and expressed by general formula of $A_xBC_{2-y}$, where x is fallen within the range of $0 \leq x \leq 2$ and y is fallen within the range of $0 \leq y < 1$, the A is vacant, the B is at least one element selected from the group consisting of titanium, vanadium, chromium, zirconium, niobium, molybdenum, hafnium, tantalum, tungsten, iridium and tin, and the C is at least one element selected from the group consisting of sulfur, selenium and tellurium.

In accordance with yet another aspect of the present invention, there is provided a compound having a $CdI_2$ analogous layer structure and expressed by general formula of $A_xBC_{2-y}$, where x is fallen within the range of $0 \leq x \leq 2$ and y is fallen within the range of $0 \leq y < 1$, the A is at least one element selected from the group consisting of lithium, sodium, potassium, rubidium, cesium, magnesium, calcium, strontium, barium, titanium, vanadium, chromium, manganese, iron, cobalt, nickel, copper, zinc (Zn), zirconium, niobium, molybdenum, ruthenium, rhodium, palladium, silver, cadmium, hafnium, tantalum, tungsten, rhenium, iridium, platinum, gold, rare-earth elements containing scandium and yttrium, boron, aluminum, gallium, indium, thallium, tin, lead, antimony and bismuth, the B is at least one element selected from the group consisting of titanium, vanadium, chromium, zirconium, niobium, molybdenum, hafnium, tantalum, tungsten, iridium and tin, and the C is at least one element selected from the group consisting of sulfur, selenium and tellurium.

In accordance with still another aspect of the present invention, there is provided a thermoelectric generator comprising a first piece of thermoelectric material and a second piece of thermoelectric material different from the second thermoelectric material, the thermoelectric material having a $CdI_2$ analogous layer structure and expressed by general formula of $A_xBC_{2-y}$ where x is fallen within the range of $0 \leq x \leq 2$ and y is fallen within the range of $0 \leq y < 1$, in which the A is at least one element selected from the group consisting of lithium, sodium, potassium, rubidium and cesium, and in which the B is at least one element selected from the group consisting of titanium, vanadium, chromium, zirconium, niobium, molybdenum, hafnium, tantalum, tungsten, iridium and tin, and in which the C is at least one element selected from the group consisting of sulfur, selenium and tellurium.

In accordance with yet another aspect of the present invention, there is provided a thermoelectric refrigerator comprising a first piece of thermoelectric material and a second piece of thermoelectric material different from the second thermoelectric material, the thermoelectric material having a $CdI_2$ analogous layer structure and expressed by general formula of $A_xBC_{2-y}$ where x is fallen within the range of $0 \leq x \leq 2$ and y is fallen within the range of $0 \leq y < 1$, in which the A is at least one element selected from the group consisting of lithium, sodium, potassium, rubidium and cesium, and in which the B is at least one element selected from the group consisting of titanium, vanadium, chromium, zirconium, niobium, molybdenum, hafnium, tantalum, tungsten, iridium and tin, and in which the C is at least one element selected from the group consisting of sulfur, selenium and tellurium.

DESCRIPTION OF THE PREFERRED EMBODIMENTS

Thermoelectric Material

The inventors discovered that attractive thermoelectric materials, which had a $CdI_2$ analogous layer structure obtained through an appropriate element substitution, intercalation and desulfurization, exhibited the electrical resistivity of the order of 1 mΩcm and Seebeck coefficient larger than 100 μV/K. The thermoelectric materials were expressed by general formula (2).

$$A_xTiS_{2-y} \tag{2}$$

The A-site was occupied by at least one Group 1 element, i.e., lithium (Li), sodium (Na), potassium (K), rubidium (Rb) and cesium (Cs). Otherwise, the A site was a vacant site, and, accordingly, the thermoelectric material was expressed as $(TiS_{2-y})$.

The inventors further discovered that the following compounds exhibited good thermoelectric properties. The compounds were expressed by the general formulae, in which part of or all of the Group 1 element or elements in the general formula (2) was replaced with at least one of the elements selected from the group consisting of Group 2 elements, i.e., magnesium (Mg), calcium (Ca), strontium (Sr) and barium (Ba), 3d-transition metals from titanium (Ti) to zinc (Zn), 4d-transition metals from zirconium (Zr) to cadmium (Cd), 5d-transition metals from hafnium (Hf) to gold (Au), rare-earth elements containing scandium (Sc) and yttrium (Y), boron (B), aluminum (Al), gallium (Ga), indium (In), thallium (Tl), tin (Sn), lead (Pb), antimony (Sb) and bismuth (Hi).

The compounds were further expressed by the general formulae, in which part of or all of titanium (Ti) is replaced with at least one element selected from the oup consisting of vanadium (V), chromium (Cr), zirconium (Zr), niobium (Nb), molybden (Mo), hafnium (Hf), tantalum (Ta), tungsten (W), iridium (k) and tin (Sn).

The compounds were further expressed by the general formulae, in which part of or all of sulfur (S) was replaced with at least one element selected from the group consisting of selenium (Se) and tellurium (Te).

The thermoelectric materials exhibited high energy converting efficiency, and the problem is solved.

The low electrical resistivity is derived from the fact that the $CdI_2$ analogous layer structure is a laminate of $TiS_6$, which exhibits a relatively high electric conductivity. The $TiS_6$ layers are bonded by the weak van der Waals force, and, accordingly, the thermal conductivity is relatively low. Moreover, the thermal conductivity is further reduced in the presence of the element or elements intercalated into the boundaries between the layers. The compound with the $CdI_2$ analogous layer structure has the large Seebeck coefficient by virtue of various features such as the large degree of freedom of orbital, electron correlation and low dimensionality.

The compounds with the $CdI_2$ analogous layer structure which were expressed by the general formulae of $A_xTiS_{2-y}$ where $0 \leq x \leq 2$ and $0 \leq y < 1$ have layers of hexagonal dense packing of sulfur ions, and Ti atoms occupy octahedral sites in every other sulfur layer. In other words, edge-sharing $TiS_6$ octahedra form infinite layers, and these layers are stacked. The $TiS_6$ layers are bonded to each other by the weak van der Waals force, and various kinds of ions and molecules are intercalated into the van der Waals gap between the $TiS_6$ layers.

The general formulae are represented by the sulfur-deficient chemical composition. The sulfur deficiency is categorized into two groups. In one group, sulfur atoms are removed from the $TiS_6$ layers. In the other group, excess Ti atoms introduced between the $TiS_6$ layers. Electric-conductivity-carriers are introduced by the deficiency of anion such as sulfur, element substitution by different valence elements, and the intercalation of atoms or molecules in the van der Waals gap between the $TiS_6$ layers. In the $TiS_6$ layers, the orbitals of cations such as Ti atoms overlap directly or indirectly overlap through the p-orbitals of the anions, thus, the electrical resistivity is low.

There is not any limit on a method for introducing the carrier. One of the carrier introduction methods is to make the sulfur atoms deficient through a quenching from a high temperature or a heat treatment in reduction atmosphere created by using hydrogen gas, nitrogen gas or argon gas. Another carrier introduction method is to substitute an element with different valance elements. Yet another carrier introduction method is to intercalate atoms and/or molecules into the van der Waals gap between the $TiS_6$ layers. The above-described methods may be mixed or combined.

In case where the introduction of carrier is carried out by intercalating atoms into the A-site, it is preferable that at least one of the above-described elements at the A-site ranges from $0.1 < x < 0.5$. In case where the introduction of carrier is carried out by substituting the above-described element or elements except for Ti for the original element at the B-site, it is preferable that the element or elements are fallen within the range from 0.1 mole % to 10 mole % in all the elements at the B-site. In other words, at least one of the elements to occupy the B-site except Ti ranges from 0.1 mole % to 10 mole %, and the remaining B-site is to be occupied by Ti.

In case where the introduction of carrier is carried out by substituting the above-described element or elements except sulfur for the original element at the C-site, it is preferable that the element or elements are fallen within the range from 0.1 mole % to 10 mole % in all the elements at the C-site. In other words, at least one of the elements to occupy the C-site except sulfur ranges from 0.1 mole % to 10 mole %, and the remaining C-site is occupied by sulfur.

Since the $TiS_6$ layers are bonded by the weak van der Waals force, the electric conduction shows strong two-dimensionally nature, and Seebeck coefficient is enhanced by such a low dimensional electronic state. The orbital degeneracy takes place in the d-orbital of the cation such as Ti and the merged orbits in the octahedral structure of $TiS_6$, and the entropy of the doped carrier is large. For this reason, the compounds exhibit the large Seebeck coefficient. Moreover, the cations such as Ti form a triangular lattices in the network where the ridgelines are shared among the octahedrons of $TiS_6$, and the geometrical spin, orbital frustration and other electron correlation are strongly influential. This results in increase of the Seebeck coefficient.

Phonon and carrier are participated in the heat conduction. It is important to restrict the heat conduction through the phonon for high performance thermoelectric materials. Since the $TiS_6$ layers are bonded by the weak van der Waals force, the thermal conductivity is inherently low. The atoms, which were intercalated into the boundaries between the $TiS_6$ layers, not only participate in the carrier conduction but also serve as the phonon scattering centers. This results in reduction in thermal conductivity.

As described hereinbefore in detail, the compounds expressed by the general formula $A_xTiS_{2-y}$ where $0 \leq x \leq 2$ and $0 \leq y < 1$ exhibit the low electrical resistivity, low thermal conductivity and large Seebeck coefficient by virtue of the above-described phenomena. As a result, large figure of merit ZT, i.e., $S^2T/\rho\kappa$ is achieved by the compounds, and are preferable for high conversion efficiency thermoelectric elements.

The thermoelectric materials according to the present invention are produced through a process for producing ceramic such as, for example, a firing on blended powder sealed in a quartz tube. Single crystal thermoelectric material according to the present invention is obtained through a precipitation from a high temperature molten compound, zone melting or chemical transportation. A thin film of the thermoelectric material according to the present invention is formed by using a sputtering, laser light evaporation or vacuum evaporation. The metals at the A-site may be intercalated into the lattice structure through an electrochemical process or reaction with organic compound.

Thermoelectric Generator and Thermoelectric Refrigerator

The thermoelectric materials according to the present invention are available for any kind of thermoelectric generator and any kind of thermoelectric refrigerator.

EXAMPLES

The inventors investigated thermoelectric materials according to the present invention. The inventors firstly prepared powder of titanium (Ti), vanadium (V), chromium (Cr), zirconium (Zr), niobium (Nb), molybdenum (Mo), hafnium (Hf), tantalum (Ta), tungsten (W), sulfur (S), selenium (Se), tellurium (Te), lithium sulfide ($Li_2S$), sodium sulfide ($Na_2S$), potassium sulfide ($K_2S$), rubidium sulfide ($Rb_2S$), cesium sulfide (CsS), magnesium sulfide (MgS), calcium sulfide (CaS), strontium sulfide (SrS), barium sulfide (BaS), scandium (Sc), yttrium sulfide ($Y_2S_3$), other rare earth metal sulfides expressed as $R_2S_3$ where R is an rare earth element, transition metals from titanium (Ti) to zinc (Zn), zirconium (Zr) to cadmium (Cd) and hafnium (Hf) to gold (Au), boron (B), aluminum (Al), gallium (Ga), indium (In), thallium (Tl), tin (Sn), lead sulfide (PbS) and bismuth sulfide ($Bi_2S_3$). The inventors blended these kinds of powder in predetermined ratios, and the mixture was shaped into disks of 15 millimeters in diameter through a pressing at 1 Gpa. In order to prevent the disks from reaction with quartz, the inventors put the disks into an aluminum crucible, and, thereafter, inserted them into quartz tubes. Thus, the disks were grouped into two groups. Vacuum was developed in the quartz tubes, and the quartz tubes were sealed. The inventors gradually raised the temperature so as to prevent the disks from violent reaction. The temperature reached 440 degrees in centigrade. The disks were held at 440 degrees in centigrade for 24 hours, and, thereafter, were fired in an electric furnace at 800 degrees in centigrade for 100 hours. One of the groups was gradually cooled in the furnace. The other group was quenched by cooling the quartz tube in water. The sulfur became deficit, and the electric conductivity was observed.

The inventors produce single crystalline thermoelectric pieces through vapor phase transportation using iodine. The single crystalline thermoelectric pieces were divided into two groups, and one of the groups was subjected to desulfurization in argon atmosphere at 800 degrees in centigrade for 12 hours. Thus, the inventors prepared various kinds of samples.

The inventors analyzed the crystal structure of the samples by using an x-ray diffraction, and confirmed that the samples had the $CdI_2$ analogous layer structure.

Subsequently, the inventors investigated the thermoelectric properties of the samples. The inventors measured the electrical resistivity $\rho$, Seebeck coefficient S and thermal conductivity $\kappa$. The direct current four-probe method was used in the measurement of the electrical resistivity. The Seebeck coefficient was determined by a constant method. First, a temperature difference was given between both ends of each sample, and the thermo-electromotive force was measured. The thermal conductivity was measured by using a laser flush method. The figure of merit ZT was calculated through equation (1), i.e., $ZT = S2\ T/\rho\kappa$.

The inventors carried out experiments (1) to (79) at room temperature, i.e., 28 degrees in centigrade and experiments (80) to (158) at 700 degrees in centigrade. The samples used in experiment Nos. 1 and 80 were gradually cooled, and the thermoelectric materials were polycrystalline. The samples used in experiment Nos. 2 and 81 were quenched, and the thermoelectric materials were also polycrystalline. The samples used in experimental No. 82 were produced through the vapor phase transportation method, and the thermoelectric material was single crystalline. The samples used in experiment Nos. 4 and 83 were produced through the process same as that for the sample used in experiment No. 3, and were further desulfurized in argon atmosphere. The samples used in experiment Nos. 6, 8, 10, 85, 87 and 89 were produced through the vapor phase transportation, and the thermoelectric materials were single crystalline. The other samples were gradually cooled, and the thermoelectric materials were polycrystalline.

The composition of the samples in experiments (1) to (79) was described in Table 1, and the thermoelectric properties were shown in Table 2. Similarly, the composition of the samples in experiments (80) to (158) was described in Table 3, and the thermoelectric properties were shown in Table 4. In Tables 1 and 3, A, B, B*, C and C* represented terms "major element at A-site", "major element at B-site", "substituted element for B", "major element at C-site" and "substituted element for C", respectively. The A-site, B-site and C-site were indicative of A, B and C in general formula of $A_xBC_{2-y}$ where $0 \leq x \leq 2$ and $0 \leq y < 1$.

TABLE 1

| No. | A Element/ Molar ratio | | B Element/ Molar ratio | | B* Element/ Molar ratio | | C Element/ Molar ratio | | C* Element/ Molar ratio | |
|---|---|---|---|---|---|---|---|---|---|---|
| 1 | — | — | Ti | 1 | — | — | S | 1 | — | — |
| 2 | — | — | Ti | 1 | — | — | S | 1 | — | — |
| 3 | — | — | Ti | 1 | — | — | S | 1 | — | — |
| 4 | — | — | Ti | 1 | — | — | S | 1 | — | — |
| 5 | Li | 0.5 | Ti | 1 | — | — | S | 1 | — | — |
| 6 | Li | 0.5 | Ti | 1 | — | — | S | 1 | — | — |
| 7 | Na | 0.5 | Ti | 1 | — | — | S | 1 | — | — |
| 8 | Na | 0.5 | Ti | 1 | — | — | S | 1 | — | — |
| 9 | K | 0.5 | Ti | 1 | — | — | S | 1 | — | — |
| 10 | K | 0.5 | Ti | 1 | — | — | S | 1 | — | — |
| 11 | Rb | 0.5 | Ti | 1 | — | — | S | 1 | — | — |
| 12 | Cs | 0.5 | Ti | 1 | — | — | S | 1 | — | — |
| 13 | Mg | 0.5 | Ti | 1 | — | — | S | 1 | — | — |
| 14 | Ca | 0.5 | Ti | 1 | — | — | S | 1 | — | — |
| 15 | Sr | 0.5 | Ti | 1 | — | — | S | 1 | — | — |
| 16 | Ba | 0.5 | Ti | 1 | — | — | S | 1 | — | — |
| 17 | Ti | 0.5 | Ti | 1 | — | — | S | 1 | — | — |
| 18 | V | 0.5 | Ti | 1 | — | — | S | 1 | — | — |
| 19 | Cr | 0.5 | Ti | 1 | — | — | S | 1 | — | — |
| 20 | Mn | 0.5 | Ti | 1 | — | — | S | 1 | — | — |
| 21 | Fe | 0.5 | Ti | 1 | — | — | S | 1 | — | — |
| 22 | Co | 0.5 | Ti | 1 | — | — | S | 1 | — | — |
| 23 | Ni | 0.5 | Ti | 1 | — | — | S | 1 | — | — |
| 24 | Cu | 0.5 | Ti | 1 | — | — | S | 1 | — | — |
| 25 | Zn | 0.5 | Ti | 1 | — | — | S | 1 | — | — |
| 26 | Zr | 0.5 | Ti | 1 | — | — | S | 1 | — | — |
| 27 | Nb | 0.5 | Ti | 1 | — | — | S | 1 | — | — |
| 28 | Mo | 0.5 | Ti | 1 | — | — | S | 1 | — | — |
| 29 | Ru | 0.5 | Ti | 1 | — | — | S | 1 | — | — |
| 30 | Rh | 0.5 | Ti | 1 | — | — | S | 1 | — | — |
| 31 | Pd | 0.5 | Ti | 1 | — | — | S | 1 | — | — |
| 32 | Ag | 0.5 | Ti | 1 | — | — | S | 1 | — | — |
| 33 | Cd | 0.5 | Ti | 1 | — | — | S | 1 | — | — |
| 34 | Hf | 0.5 | Ti | 1 | — | — | S | 1 | — | — |
| 35 | Ta | 0.5 | Ti | 1 | — | — | S | 1 | — | — |
| 36 | W | 0.5 | Ti | 1 | — | — | S | 1 | — | — |
| 37 | Re | 0.5 | Ti | 1 | — | — | S | 1 | — | — |
| 38 | Ir | 0.5 | Ti | 1 | — | — | S | 1 | — | — |
| 39 | Pt | 0.5 | Ti | 1 | — | — | S | 1 | — | — |
| 40 | Au | 0.5 | Ti | 1 | — | — | S | 1 | — | — |
| 41 | Sc | 0.5 | Ti | 1 | — | — | S | 1 | — | — |
| 42 | Y | 0.5 | Ti | 1 | — | — | S | 1 | — | — |
| 43 | La | 0.5 | Ti | 1 | — | — | S | 1 | — | — |
| 44 | Ce | 0.5 | Ti | 1 | — | — | S | 1 | — | — |
| 45 | Nd | 0.5 | Ti | 1 | — | — | S | 1 | — | — |
| 46 | Pr | 0.5 | Ti | 1 | — | — | S | 1 | — | — |
| 47 | Sm | 0.5 | Ti | 1 | — | — | S | 1 | — | — |
| 48 | Eu | 0.5 | Ti | 1 | — | — | S | 1 | — | — |
| 49 | Gd | 0.5 | Ti | 1 | — | — | S | 1 | — | — |
| 50 | Tb | 0.5 | Ti | 1 | — | — | S | 1 | — | — |
| 51 | Dy | 0.5 | Ti | 1 | — | — | S | 1 | — | — |
| 52 | Ho | 0.5 | Ti | 1 | — | — | S | 1 | — | — |
| 53 | Er | 0.5 | Ti | 1 | — | — | S | 1 | — | — |
| 54 | Tm | 0.5 | Ti | 1 | — | — | S | 1 | — | — |
| 55 | Yb | 0.5 | Ti | 1 | — | — | S | 1 | — | — |
| 56 | Lu | 0.5 | Ti | 1 | — | — | S | 1 | — | — |
| 57 | B | 0.5 | Ti | 1 | — | — | S | 1 | — | — |
| 58 | Al | 0.5 | Ti | 1 | — | — | S | 1 | — | — |
| 59 | Ga | 0.5 | Ti | 1 | — | — | S | 1 | — | — |
| 60 | In | 0.5 | Ti | 1 | — | — | S | 1 | — | — |

TABLE 1-continued

| No. | A Element/ Molar ratio | | B Element/ Molar ratio | | B* Element/ Molar ratio | | C Element/ Molar ratio | | C* Element/ Molar ratio | |
|---|---|---|---|---|---|---|---|---|---|---|
| 61 | Tl | 0.5 | Ti | 1 | — | — | S | 1 | — | — |
| 62 | Sn | 0.5 | Ti | 1 | — | — | S | 1 | — | — |
| 63 | Pb | 0.5 | Ti | 1 | — | — | S | 1 | — | — |
| 64 | Sb | 0.5 | Ti | 1 | — | — | S | 1 | — | — |
| 65 | Bi | 0.5 | Ti | 1 | — | — | S | 1 | — | — |
| 66 | — | — | Ti | 0.9 | V | 0.1 | S | 1 | — | — |
| 67 | — | — | Ti | 0.9 | Cr | 0.1 | S | 1 | — | — |
| 68 | — | — | Ti | 0.9 | Zr | 0.1 | S | 1 | — | — |
| 69 | — | — | Ti | 0.9 | Nb | 0.1 | S | 1 | — | — |
| 70 | — | — | Ti | 0.9 | Mo | 0.1 | S | 1 | — | — |
| 71 | — | — | Ti | 0.9 | Hf | 0.1 | S | 1 | — | — |
| 72 | — | — | Ti | 0.9 | Ta | 0.1 | S | 1 | — | — |
| 73 | — | — | Ti | 0.9 | W | 0.1 | S | 1 | — | — |
| 74 | — | — | Ti | 0.9 | Ir | 0.1 | S | 1 | — | — |
| 75 | — | — | Ti | 0.9 | Sn | 0.1 | S | 1 | — | — |
| 76 | — | — | Ti | 1 | — | — | S | 0.9 | Se | 0.1 |
| 77 | — | — | Ti | 1 | — | — | S | 0 | Se | 1 |
| 78 | — | — | Ti | 1 | — | — | S | 0.9 | Te | 0.1 |
| 79 | — | — | Ti | 1 | — | — | S | 0 | Te | 1 |

TABLE 2

| No. | Seebeck Coefficient μV/K° | Electrical Resistivity m Ω cm | Thermal Conductivity mW/K° cm | Figure of Merit |
|---|---|---|---|---|
| 1 | −200 | 0.8 | 10 | 1.50 |
| 2 | −180 | 0.7 | 10 | 1.39 |
| 3 | −170 | 0.1 | 30 | 2.89 |
| 4 | −160 | 0.08 | 35 | 2.74 |
| 5 | −185 | 0.82 | 11 | 1.14 |
| 6 | −139 | 0.07 | 28 | 2.96 |
| 7 | −197 | 0.86 | 12 | 1.13 |
| 8 | −141 | 0.08 | 25 | 2.98 |
| 9 | −193 | 0.87 | 10 | 1.28 |
| 10 | −144 | 0.09 | 24 | 2.88 |
| 11 | −196 | 0.87 | 11 | 1.20 |
| 12 | −195 | 0.87 | 11 | 1.19 |
| 13 | −194 | 0.87 | 11 | 1.18 |
| 14 | −195 | 0.87 | 12 | 1.09 |
| 15 | −198 | 0.87 | 11 | 1.23 |
| 16 | −200 | 0.9 | 11 | 1.21 |
| 17 | −199 | 0.82 | 12 | 1.21 |
| 18 | −197 | 0.84 | 11 | 1.26 |
| 19 | −196 | 0.85 | 10 | 1.36 |
| 20 | −196 | 0.87 | 11 | 1.20 |
| 21 | −196 | 0.84 | 11 | 1.25 |
| 22 | −196 | 0.86 | 12 | 1.12 |
| 23 | −194 | 0.85 | 12 | 1.11 |
| 24 | −196 | 0.87 | 11 | 1.20 |
| 25 | −196 | 0.87 | 11 | 1.20 |
| 26 | −194 | 0.82 | 12 | 1.15 |
| 27 | −195 | 0.87 | 11 | 1.19 |
| 28 | −196 | 0.87 | 12 | 1.10 |
| 29 | −194 | 0.85 | 11 | 1.21 |
| 30 | −196 | 0.87 | 11 | 1.20 |
| 31 | −193 | 0.84 | 11 | 1.21 |
| 32 | −196 | 0.87 | 12 | 1.10 |
| 33 | −189 | 0.83 | 12 | 1.08 |
| 34 | −184 | 0.8 | 11 | 1.15 |
| 35 | −187 | 0.79 | 12 | 1.11 |
| 36 | −188 | 0.8 | 11 | 1.20 |
| 37 | −190 | 0.83 | 12 | 1.09 |
| 38 | −191 | 0.84 | 12 | 1.09 |
| 39 | −188 | 0.86 | 12 | 1.03 |
| 40 | −192 | 0.87 | 12 | 1.06 |
| 41 | −196 | 0.86 | 12 | 1.12 |
| 42 | −189 | 0.88 | 11 | 1.11 |
| 43 | −192 | 0.87 | 10 | 1.27 |
| 44 | −198 | 0.86 | 13 | 1.05 |
| 45 | −190 | 0.87 | 10 | 1.24 |

TABLE 2-continued

| No. | Seebeck Coefficient μV/K° | Electrical Resistivity m Ω cm | Thermal Conductivity mW/K° cm | Figure of Merit |
|---|---|---|---|---|
| 46 | −191 | 0.87 | 10 | 1.26 |
| 47 | −188 | 0.87 | 11 | 1.11 |
| 48 | −192 | 0.87 | 12 | 1.06 |
| 49 | −190 | 0.83 | 12 | 1.09 |
| 50 | −194 | 0.87 | 12 | 1.08 |
| 51 | −193 | 0.87 | 12 | 1.07 |
| 52 | −190 | 0.81 | 12 | 1.11 |
| 53 | −188 | 0.87 | 10 | 1.22 |
| 54 | −187 | 0.87 | 10 | 1.21 |
| 55 | −190 | 0.87 | 11 | 1.13 |
| 56 | −194 | 0.84 | 12 | 1.12 |
| 57 | −188 | 0.8 | 12 | 1.10 |
| 58 | −187 | 0.87 | 11 | 1.10 |
| 59 | −189 | 0.79 | 12 | 1.13 |
| 60 | −184 | 0.8 | 10 | 1.27 |
| 61 | −194 | 0.87 | 12 | 1.08 |
| 62 | −196 | 0.77 | 13 | 1.15 |
| 63 | −195 | 0.82 | 12 | 1.16 |
| 64 | −197 | 0.87 | 12 | 1.12 |
| 65 | −193 | 0.85 | 12 | 1.10 |
| 66 | −192 | 0.87 | 11 | 1.16 |
| 67 | −194 | 0.87 | 11 | 1.18 |
| 68 | −188 | 0.76 | 12 | 1.16 |
| 69 | −194 | 0.79 | 12 | 1.19 |
| 70 | −192 | 0.84 | 12 | 1.10 |
| 71 | −192 | 0.87 | 10 | 1.27 |
| 72 | −194 | 0.83 | 12 | 1.13 |
| 73 | −196 | 0.87 | 12 | 1.10 |
| 74 | −198 | 0.87 | 12 | 1.13 |
| 75 | −196 | 0.87 | 10 | 1.32 |
| 76 | −195 | 0.87 | 10 | 1.31 |
| 77 | −193 | 0.85 | 10 | 1.31 |
| 78 | −197 | 0.86 | 10 | 1.35 |
| 79 | −192 | 0.84 | 10 | 1.32 |

TABLE 3

| No. | A Element/Molar ratio | | B Element/Molar ratio | | B* Element/Molar ratio | | C Element/Molar ratio | | C* Element/Molar ratio | |
|---|---|---|---|---|---|---|---|---|---|---|
| 80 | — | — | Ti | 1 | — | — | S | 1 | — | — |
| 81 | — | — | Ti | 1 | — | — | S | 1 | — | — |
| 82 | — | — | Ti | 1 | — | — | S | 1 | — | — |
| 83 | — | — | Ti | 1 | — | — | S | 1 | — | — |
| 84 | Li | 0.5 | Ti | 1 | — | — | S | 1 | — | — |
| 85 | Li | 0.5 | Ti | 1 | — | — | S | 1 | — | — |
| 86 | Na | 0.5 | Ti | 1 | — | — | S | 1 | — | — |
| 87 | Na | 0.5 | Ti | 1 | — | — | S | 1 | — | — |
| 88 | K | 0.5 | Ti | 1 | — | — | S | 1 | — | — |
| 89 | K | 0.5 | Ti | 1 | — | — | S | 1 | — | — |
| 90 | Rb | 0.5 | Ti | 1 | — | — | S | 1 | — | — |
| 91 | Cs | 0.5 | Ti | 1 | — | — | S | 1 | — | — |
| 92 | Mg | 0.5 | Ti | 1 | — | — | S | 1 | — | — |
| 93 | Ca | 0.5 | Ti | 1 | — | — | S | 1 | — | — |
| 94 | Sr | 0.5 | Ti | 1 | — | — | S | 1 | — | — |
| 95 | Ba | 0.5 | Ti | 1 | — | — | S | 1 | — | — |
| 96 | Ti | 0.5 | Ti | 1 | — | — | S | 1 | — | — |
| 97 | V | 0.5 | Ti | 1 | — | — | S | 1 | — | — |
| 98 | Cr | 0.5 | Ti | 1 | — | — | S | 1 | — | — |
| 99 | Mn | 0.5 | Ti | 1 | — | — | S | 1 | — | — |
| 100 | Fe | 0.5 | Ti | 1 | — | — | S | 1 | — | — |
| 101 | Co | 0.5 | Ti | 1 | — | — | S | 1 | — | — |
| 102 | Ni | 0.5 | Ti | 1 | — | — | S | 1 | — | — |
| 103 | Cu | 0.5 | Ti | 1 | — | — | S | 1 | — | — |
| 104 | Zn | 0.5 | Ti | 1 | — | — | S | 1 | — | — |
| 105 | Zr | 0.5 | Ti | 1 | — | — | S | 1 | — | — |
| 106 | Nb | 0.5 | Ti | 1 | — | — | S | 1 | — | — |
| 107 | Mo | 0.5 | Ti | 1 | — | — | S | 1 | — | — |
| 108 | Ru | 0.5 | Ti | 1 | — | — | S | 1 | — | — |
| 109 | Rh | 0.5 | Ti | 1 | — | — | S | 1 | — | — |
| 110 | Pd | 0.5 | Ti | 1 | — | — | S | 1 | — | — |
| 111 | Ag | 0.5 | Ti | 1 | — | — | S | 1 | — | — |
| 112 | Cd | 0.5 | Ti | 1 | — | — | S | 1 | — | — |
| 113 | Hf | 0.5 | Ti | 1 | — | — | S | 1 | — | — |
| 114 | Ta | 0.5 | Ti | 1 | — | — | S | 1 | — | — |
| 115 | W | 0.5 | Ti | 1 | — | — | S | 1 | — | — |
| 116 | Re | 0.5 | Ti | 1 | — | — | S | 1 | — | — |
| 117 | Ir | 0.5 | Ti | 1 | — | — | S | 1 | — | — |
| 118 | Pt | 0.5 | Ti | 1 | — | — | S | 1 | — | — |
| 119 | Au | 0.5 | Ti | 1 | — | — | S | 1 | — | — |
| 120 | Sc | 0.5 | Ti | 1 | — | — | S | 1 | — | — |
| 121 | Y | 0.5 | Ti | 1 | — | — | S | 1 | — | — |
| 122 | La | 0.5 | Ti | 1 | — | — | S | 1 | — | — |
| 123 | Ce | 0.5 | Ti | 1 | — | — | S | 1 | — | — |
| 124 | Nd | 0.5 | Ti | 1 | — | — | S | 1 | — | — |
| 125 | Pr | 0.5 | Ti | 1 | — | — | S | 1 | — | — |
| 126 | Sm | 0.5 | Ti | 1 | — | — | S | 1 | — | — |
| 127 | Eu | 0.5 | Ti | 1 | — | — | S | 1 | — | — |
| 128 | Gd | 0.5 | Ti | 1 | — | — | S | 1 | — | — |
| 129 | Tb | 0.5 | Ti | 1 | — | — | S | 1 | — | — |
| 130 | Dy | 0.5 | Ti | 1 | — | — | S | 1 | — | — |
| 131 | Ho | 0.5 | Ti | 1 | — | — | S | 1 | — | — |
| 132 | Er | 0.5 | Ti | 1 | — | — | S | 1 | — | — |
| 133 | Tm | 0.5 | Ti | 1 | — | — | S | 1 | — | — |
| 134 | Yb | 0.5 | Ti | 1 | — | — | S | 1 | — | — |
| 135 | Lu | 0.5 | Ti | 1 | — | — | S | 1 | — | — |
| 136 | B | 0.5 | Ti | 1 | — | — | S | 1 | — | — |
| 137 | Al | 0.5 | Ti | 1 | — | — | S | 1 | — | — |
| 138 | Ga | 0.5 | Ti | 1 | — | — | S | 1 | — | — |
| 139 | In | 0.5 | Ti | 1 | — | — | S | 1 | — | — |
| 140 | Tl | 0.5 | Ti | 1 | — | — | S | 1 | — | — |
| 141 | Sn | 0.5 | Ti | 1 | — | — | S | 1 | — | — |
| 142 | Pb | 0.5 | Ti | 1 | — | — | S | 1 | — | — |
| 143 | Sb | 0.5 | Ti | 1 | — | — | S | 1 | — | — |
| 144 | Bi | 0.5 | Ti | 1 | — | — | S | 1 | — | — |
| 145 | — | — | Ti | 0.9 | V | 0.1 | S | 1 | — | — |
| 146 | — | — | Ti | 0.9 | Cr | 0.1 | S | 1 | — | — |
| 147 | — | — | Ti | 0.9 | Zr | 0.1 | S | 1 | — | — |
| 148 | — | — | Ti | 0.9 | Nb | 0.1 | S | 1 | — | — |
| 149 | — | — | Ti | 0.9 | Mo | 0.1 | S | 1 | — | — |
| 150 | — | — | Ti | 0.9 | Hf | 0.1 | S | 1 | — | — |
| 151 | — | — | Ti | 0.9 | Ta | 0.1 | S | 1 | — | — |
| 152 | — | — | Ti | 0.9 | W | 0.1 | S | 1 | — | — |
| 153 | — | — | Ti | 0.9 | Ir | 0.1 | S | 1 | — | — |
| 154 | — | — | Ti | 0.9 | Sn | 0.1 | S | 1 | — | — |
| 155 | — | — | Ti | 1 | — | — | S | 0.9 | Se | 0.1 |
| 156 | — | — | Ti | 1 | — | — | S | 0 | Se | 1 |
| 157 | — | — | Ti | 1 | — | — | S | 0.9 | Te | 0.1 |
| 158 | — | — | Ti | 1 | — | — | S | 0 | Te | 1 |

TABLE 4

| No. | Seebeck Coefficient μV/K° | Electrical Resistivity m Ω cm | Thermal Conductivity mW/K° cm | Figure of Merit |
|---|---|---|---|---|
| 80 | −210 | 1 | 15 | 2.86 |
| 81 | −200 | 0.9 | 17 | 2.54 |
| 82 | −195 | 0.3 | 32 | 3.85 |
| 83 | −190 | 0.28 | 33 | 3.80 |
| 84 | −204 | 1.2 | 16 | 2.11 |
| 85 | −165 | 0.24 | 28 | 3.94 |
| 86 | −205 | 1 | 18 | 2.27 |
| 87 | −165 | 0.28 | 27 | 3.50 |
| 88 | −203 | 1.1 | 16 | 2.28 |
| 89 | −167 | 0.29 | 26 | 3.60 |
| 90 | −202 | 1.3 | 19 | 1.61 |
| 91 | −204 | 1.3 | 17 | 1.83 |
| 92 | −206 | 1.2 | 18 | 1.91 |
| 93 | −204 | 1.2 | 18 | 1.87 |
| 94 | −202 | 1.1 | 18 | 2.01 |

TABLE 4-continued

| No. | Seebeck Coefficient $\mu V/K°$ | Electrical Resistivity m Ω cm | Thermal Conductivity mW/K° cm | Figure of Merit |
|---|---|---|---|---|
| 95 | −200 | 1.2 | 18 | 1.80 |
| 96 | −199 | 1.2 | 17 | 1.89 |
| 97 | −197 | 1.2 | 18 | 1.75 |
| 98 | −196 | 1.2 | 17 | 1.83 |
| 99 | −196 | 1.2 | 18 | 1.73 |
| 100 | −201 | 1.2 | 18 | 1.82 |
| 101 | −203 | 1.2 | 17 | 1.97 |
| 102 | −201 | 1.2 | 18 | 1.82 |
| 103 | −200 | 1.2 | 18 | 1.80 |
| 104 | −205 | 1.2 | 19 | 1.79 |
| 105 | −201 | 1.2 | 17 | 1.93 |
| 106 | −200 | 1.2 | 17 | 1.91 |
| 107 | −202 | 1.2 | 17 | 1.95 |
| 108 | −203 | 1.2 | 18 | 1.86 |
| 109 | −210 | 1.2 | 19 | 1.88 |
| 110 | −209 | 1.2 | 19 | 1.86 |
| 111 | −203 | 1.1 | 19 | 1.92 |
| 112 | −205 | 1.2 | 18 | 1.89 |
| 113 | −206 | 1.2 | 18 | 1.91 |
| 114 | −200 | 1.2 | 17 | 1.91 |
| 115 | −201 | 1.1 | 19 | 1.88 |
| 116 | −203 | 1.2 | 18 | 1.86 |
| 117 | −205 | 1.2 | 18 | 1.89 |
| 118 | −200 | 1.1 | 18 | 1.97 |
| 119 | −206 | 1.2 | 19 | 1.81 |
| 120 | −210 | 1.2 | 17 | 2.10 |
| 121 | −208 | 1.2 | 17 | 2.06 |
| 122 | −207 | 1.2 | 17 | 2.04 |
| 123 | −203 | 1.2 | 18 | 1.86 |
| 124 | −205 | 1.2 | 18 | 1.89 |
| 125 | −200 | 1 | 18 | 2.16 |
| 126 | −206 | 1.2 | 19 | 1.81 |
| 127 | −206 | 1.2 | 18 | 1.91 |
| 128 | −205 | 1.2 | 17 | 2.00 |
| 129 | −206 | 1.2 | 17 | 2.02 |
| 130 | −207 | 1.2 | 18 | 1.93 |
| 131 | −203 | 1 | 19 | 2.11 |
| 132 | −202 | 1.2 | 18 | 1.84 |
| 133 | −205 | 1.2 | 18 | 1.89 |
| 134 | −208 | 1.2 | 18 | 1.95 |
| 135 | −206 | 1.2 | 18 | 1.91 |
| 136 | −203 | 1.1 | 17 | 2.14 |
| 137 | −201 | 1 | 18 | 2.18 |
| 138 | −208 | 1.2 | 18 | 1.95 |
| 139 | −210 | 1.2 | 18 | 1.99 |
| 140 | −200 | 1 | 19 | 2.05 |
| 141 | −210 | 1.2 | 18 | 1.99 |
| 142 | −209 | 1.2 | 18 | 1.97 |
| 143 | −205 | 1.2 | 18 | 1.89 |
| 144 | −204 | 1.2 | 17 | 1.98 |
| 145 | −210 | 1.2 | 17 | 2.10 |
| 146 | −211 | 1.2 | 18 | 2.01 |
| 147 | −205 | 1.2 | 18 | 1.89 |
| 148 | −208 | 1.2 | 19 | 1.85 |
| 149 | −204 | 1.2 | 18 | 1.87 |
| 150 | −207 | 1.2 | 17 | 2.04 |
| 151 | −209 | 1.05 | 18 | 2.25 |
| 152 | −204 | 1.2 | 16 | 2.11 |
| 153 | −207 | 1.1 | 16 | 2.37 |
| 154 | −206 | 1.2 | 17 | 2.02 |
| 155 | −226 | 1.2 | 19 | 2.18 |
| 156 | −220 | 1 | 20 | 2.35 |
| 157 | −220 | 1.3 | 17 | 2.13 |
| 158 | −215 | 1 | 19 | 2.37 |

From Tables 2 and 4, it was understood that the $CdI_2$ analogous layer structure compounds, which were expressed by the general formula of $A_xBC_{2-y}$ ($0 \leq x \leq 2$ and $0 \leq y < 1$), exhibited the figure of merit better than that of the prior art thermoelectric materials at room temperature and 700 degrees in centigrade.

As will be appreciated from the foregoing description, the thermoelectric material according to the present invention exhibit the large figure of merit, and, accordingly, are available for the thermoelectric generators and thermoelectric refrigerators. The thermoelectric generators and thermoelectric refrigerators achieve high energy converting efficiency by virtue of the large figure of merit of the thermoelectric materials according to the present invention.

Although particular embodiments of the present invention have been shown and described, it will be apparent to those skilled in the art that various changes and modifications may be made without departing from the spirit and scope of the present invention.

What is claimed is:

1. A thermoelectric refrigerator comprising a first piece of thermoelectric material and a second piece of thermoelectric material different from said second thermoelectric material, said thermoelectric material having a $CdI_2$ analogous layer structure and expressed by general formula of

$$A_xBC_{2-y}$$

where x is fallen within the range of $0 \leq x \leq 2$ and y is fall within the range of $0 \leq y < 1$, in which said A is at least one element selected from the group consisting of lithium, sodium, potassium, rubidium and cesium, and is which said B is at least one element selected from the group consisting of titanium, vanadium, chromium, zirconium, niobium, molybdenum, hafnium, tantalum, tungsten, iridium and tin, and in which said C is at least one element selected from the group consisting of sulfur, selenium and tellurium.

2. The thermoelectric refrigerator as set forth in claim 1, in which said at least one element occupying at said A is totally replaced with at least one element selected from the group consisting of magnesium, calcium, strontium, banium, titanium, vanadium, chromium, manganese, iron, cobalt, nickel, copper, zinc (Zn), zirconium, niobium, molybdenum, ruthenium, rhodium, palladium, silver, cadmium, hafnium, tantalum, tungsten, rhenium, iridium, platinum, gold, rare-earth elements containing scandium, and yttrium, boron, aluminum, gallium, indium, thallium, tin, lead, antimony and bismuth.

* * * * *